United States Patent
Otremba et al.

(10) Patent No.: US 11,804,424 B2
(45) Date of Patent: Oct. 31, 2023

(54) METHOD FOR FABRICATING A SEMICONDUCTOR DEVICE BY USING DIFFERENT CONNECTION METHODS FOR THE SEMICONDUCTOR DIE AND THE CLIP

(71) Applicant: Infineon Technologies Austria AG, Villach (AT)

(72) Inventors: Ralf Otremba, Kaufbeuren (DE); Chii Shang Hong, Melaka (MY); Jo Ean Joanna Chye, Penang (MY); Teck Sim Lee, Melaka (MY); Hui Kin Lit, Melaka (MY); Ke Yan Tean, Melaka (MY); Lee Shuang Wang, Melaka (MY); Wei-Shan Wang, Neubiberg (DE)

(73) Assignee: Infineon Technologies Austria AG, Villach (AT)

( * ) Notice: Subject to any disclaimer, the term of this patent is extended or adjusted under 35 U.S.C. 154(b) by 416 days.

(21) Appl. No.: 17/108,079

(22) Filed: Dec. 1, 2020

(65) Prior Publication Data
US 2021/0175157 A1 Jun. 10, 2021

(30) Foreign Application Priority Data
Dec. 5, 2019 (DE) .......................... 102019133235.4

(51) Int. Cl.
*H01L 23/495* (2006.01)
*H01L 23/00* (2006.01)
*H01L 23/31* (2006.01)

(52) U.S. Cl.
CPC .... *H01L 23/49562* (2013.01); *H01L 23/3107* (2013.01); *H01L 23/4952* (2013.01); *H01L 24/83* (2013.01); *H01L 2224/8381* (2013.01); *H01L 2224/8382* (2013.01)

(58) Field of Classification Search
CPC .......... H01L 23/49562; H01L 23/3107; H01L 23/4952; H01L 24/83
See application file for complete search history.

(56) References Cited

U.S. PATENT DOCUMENTS

| | | | |
|---|---|---|---|
| 2009/0108467 A1* | 4/2009 | Otremba | H01L 25/18 438/109 |
| 2014/0001480 A1* | 1/2014 | Otremba | H01L 23/49562 257/676 |
| 2016/0111346 A1* | 4/2016 | Hoeglauer | H01L 23/3135 257/685 |

FOREIGN PATENT DOCUMENTS

| | | |
|---|---|---|
| DE | 102008051965 A1 | 7/2009 |
| DE | 102009006152 A1 | 7/2009 |

(Continued)

*Primary Examiner* — Marc Anthony Armand
(74) *Attorney, Agent, or Firm* — Murphy, Bilak & Homiller, PLLC (57) ABSTRACT

A semiconductor device includes a carrier, a first external contact, a second external contact, and a semiconductor die. The semiconductor die has a first main face, a second main face opposite to the first main face, a first contact pad disposed on the first main face, a second contact pad disposed on the second main face, a third contact pad disposed on the second main face, and a vertical transistor. The semiconductor die is disposed with the first main face on the carrier. A clip connects the second contact pad to the second external contact. A first bond wire is connected between the third contact pad and the first external contact. The first bond wire is disposed at least partially under the clip.

20 Claims, 4 Drawing Sheets

(56) References Cited

FOREIGN PATENT DOCUMENTS

| DE | 102011077757 A1 | 5/2012 |
|----|-----------------|--------|
| DE | 102013015942 A1 | 3/2014 |

* cited by examiner

METHOD FOR FABRICATING A SEMICONDUCTOR DEVICE BY USING DIFFERENT CONNECTION METHODS FOR THE SEMICONDUCTOR DIE AND THE CLIP

TECHNICAL FIELD

The present disclosure is related to method for fabricating a semiconductor device and to a semiconductor device. The present disclosure is in particular related to a semiconductor device which comprises a semiconductor die having contact pads on both main faces thereof, a clip connected with one of the contact pads, and a bond wire, wherein the bond wire is disposed at least partially under the clip.

BACKGROUND

In the field of semiconductor transistor device fabrication, improvements in semiconductor die technology lead to reducing sizes of semiconductor dies. This enables less space on top of the die for soldering or sintering a clip to the source electrode. The clip often has to be reduced in size in order to accommodate a gate bond wire or a current sense bond wire. This reduces the area available for top side cooling of the package.

SUMMARY

A first aspect of the present disclosure is related to a method for fabricating a semiconductor device, comprising providing a carrier, providing first and second external contacts, providing a semiconductor die comprising a first main face and a second main face opposite to the first main face, a first contact pad disposed on the first main face and a second contact pad disposed on the second main face and a third contact pad disposed on the second main face, wherein the semiconductor die comprises a vertical transistor, connecting the semiconductor die with its first main face to the carrier, providing a first bond wire, connecting one end of the first bond wire to the third contact pad and the other end to the first external contact, providing a clip, connecting a first end of the clip to the second contact pad and a second end to the second external contact, wherein connecting the semiconductor die to the carrier and connecting the clip between the second contact pad and the second external contact are performed by different connection methods.

A second aspect of the present disclosure is related to a method for fabricating a semiconductor device, comprising providing a carrier, providing first and second external contacts, providing a semiconductor die comprising a first main face and a second main face opposite to the first main face, a first contact pad disposed on the first main face and a second contact pad disposed on the second main face and a third contact pad disposed on the second main face, wherein the semiconductor die comprises a vertical transistor, connecting the semiconductor die with its first main face to the carrier, providing a first bond wire, connecting one end of the first bond wire to the third contact pad and the other end to the first external contact, providing a clip, connecting a first end of the clip to the second contact pad and a second end to the second external contact, wherein connecting the first bond wire between the first external contact and the third contact pad is performed between the steps of connecting the semiconductor die to the carrier and connecting the clip between the second contact pad and the second external contact.

A third aspect of the present disclosure is related to a semiconductor device, comprising a carrier (11), a first external contact and a second external contact, a semiconductor die comprising a first main face and a second main face opposite to the first main face, a first contact pad disposed on the first main face, a second contact pad disposed on the second main face, and a third contact pad disposed on the second main face, wherein the semiconductor die comprises a vertical transistor and is disposed with its first main face on the carrier, a clip connecting the second contact pad to the second external contact, and a first bond wire connected with the first external contact, wherein the first bond wire is connected between the third contact pad and the first external contact, and wherein the first bond wire is disposed at least partially under the clip.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

DETAILED DESCRIPTION

The present disclosure makes it possible to place the bond wire onto the die and to allow a large clip to be placed over the die, in particular onto the source or emitter electrode of a semiconductor MOSFET die. The large clip can be either over-molded or exposed to allow efficient dual side cooling.

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure.

The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

In the following connection methods will be described which make use of solder materials like, for example, diffusion soldering or solder paste. Such solder materials may comprise Sn or any Sn alloy with two or more further elements like, for example, Sn/Au, Sn/Ag, or Sn/Au/Ag.

Figure 1:
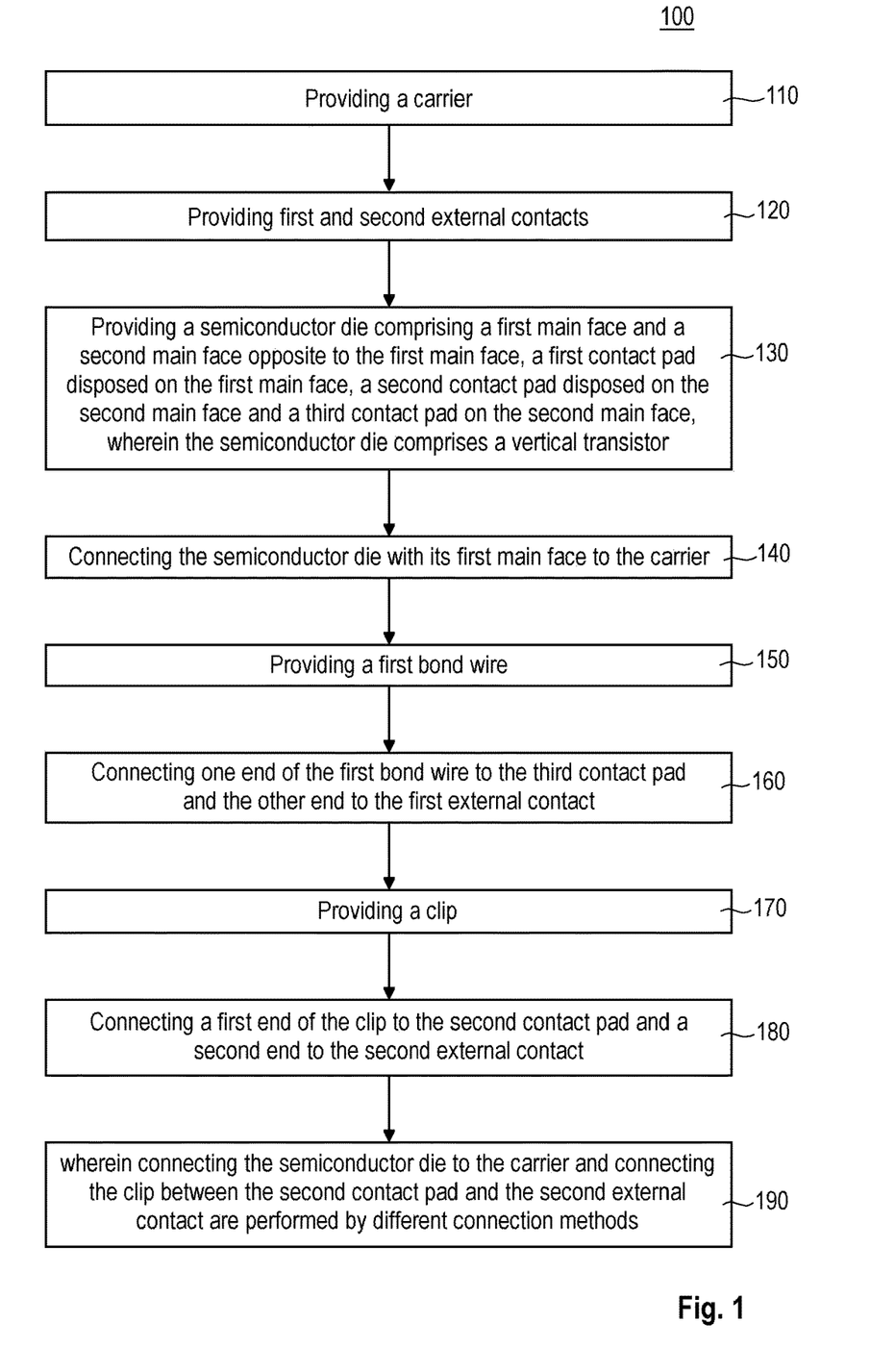
FIG. 1 shows a flow diagram for illustrating a method according to a first aspect for fabricating a semiconductor device.

FIG. 1 shows a flow diagram for illustrating a method according to the first aspect for fabricating a semiconductor device.

The method of FIG. 1 comprises providing a carrier (110), providing first and second external contacts (120), providing a semiconductor die comprising a first main face and a second main face opposite to the first main face, a first contact pad disposed on the first main face and a second contact pad disposed on the second main face and a third contact pad disposed on the second main face, wherein the semiconductor die comprises a vertical transistor, connecting the semiconductor die with its first main face to the carrier (140), providing a first bond wire (150), connecting one end of the first bond wire to the third contact pad and the other end to the first external contact (160), providing a clip (170), connecting a first end of the clip to the second contact pad and a second end to the second external contact (180), wherein connecting the semiconductor die to the carrier and connecting the clip between the second contact pad and the second external contact are performed by different connection methods (190).

According to an embodiment of the method of FIG. 1, connecting the semiconductor die to the carrier is performed by one of diffusion soldering, in particular without flux, or sintering, in particular silver sintering. Consequently, connecting the clip to the second contact pad is then performed by another method and not by diffusion soldering or sintering. This other method can be, for example, one of using a solder paste or using a silver conductive adhesive.

According to an embodiment of the method of FIG. 1, connecting the clip to the second contact pad is performed by one of using a solder paste or using a silver conductive adhesive. Consequently, connecting the semiconductor die to the carrier is performed by another method and not by using a solder paste or using a silver conductive adhesive. This other method can be, for example, one of diffusion soldering, in particular without flux, or sintering, in particular silver sintering.

According to an embodiment of the method of FIG. 1, connecting the first bond wire between the first external contact and the third contact pad is performed between the steps of connecting the semiconductor die to the carrier and connecting the clip between the second contact pad and the second external contact.

According to an embodiment of the method of FIG. 1, connecting the first bond wire to the first external contact and connecting the clip to the second contact pad is performed in such a way that the first bond wire is disposed at least partially under the clip. Examples thereof will be shown in connection with FIGS. 3 to 5 and the accompanying description of the semiconductor devices presented therein.

Figure 2:
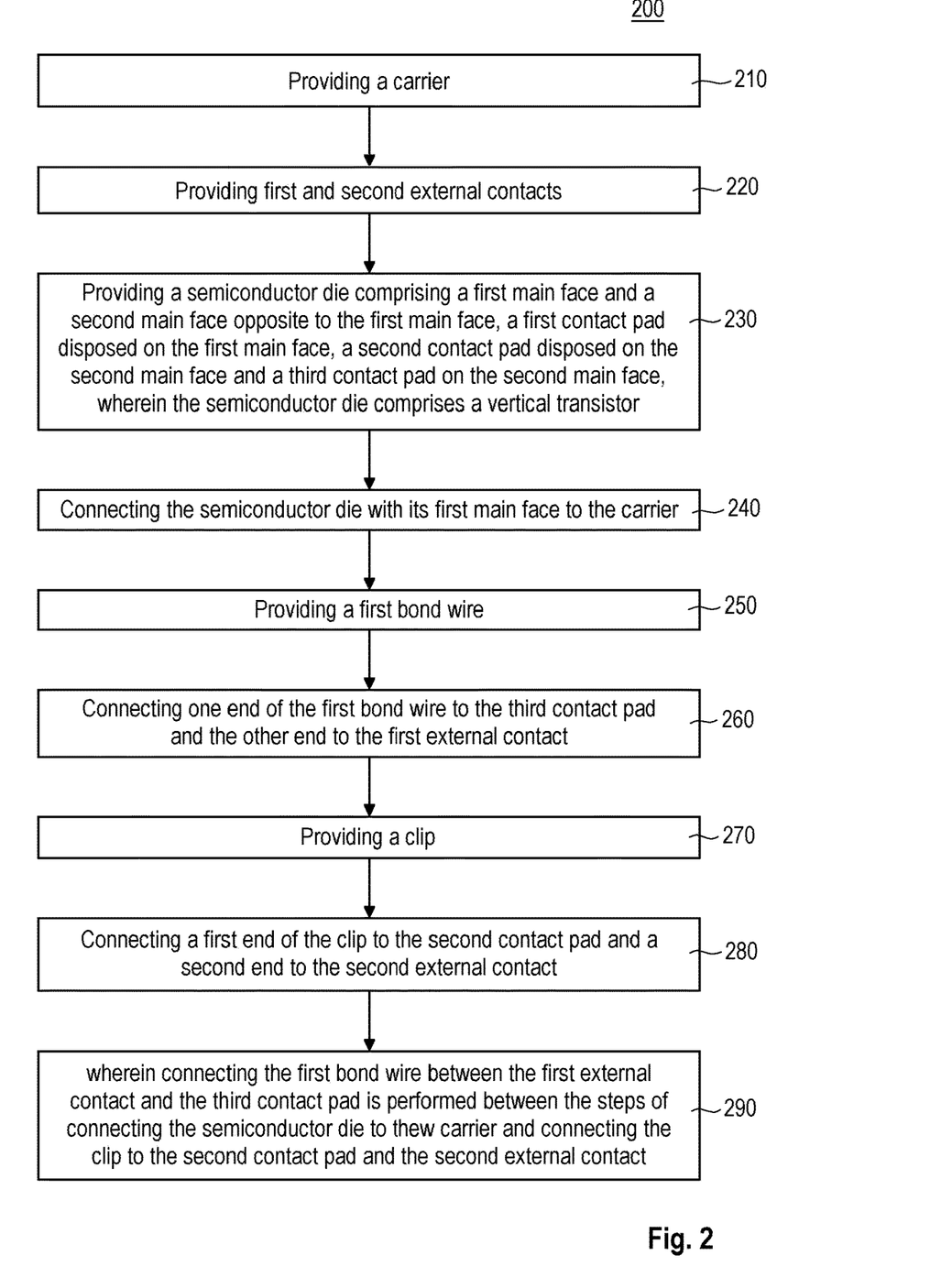
FIG. 2 shows a flow diagram for illustrating a method according to a second aspect for fabricating a semiconductor device.

FIG. 2 shows a flow diagram for illustrating a method according to the second aspect for fabricating a semiconductor device.

The method of FIG. 2 comprises providing a carrier (210), providing first and second external contacts (220), providing a semiconductor die comprising a first main face and a second main face opposite to the first main face, a first contact pad disposed on the first main face and a second contact pad disposed on the second main face and a third contact pad disposed on the second main face, wherein the semiconductor die comprises a vertical transistor (230), connecting the semiconductor die with its first main face to the carrier (240), providing a first bond wire (250), connecting one end of the first bond wire to the third contact pad and the other end to the first external contact (260), providing a clip (270), connecting a first end of the clip to the second contact pad and a second end to the second external contact (280), wherein connecting the first bond wire between the first external contact and the third contact pad is performed between the steps of connecting the semiconductor die to the carrier and connecting the clip between the second contact pad and the second external contact (290).

According to an embodiment of the method of FIG. 1, connecting the semiconductor die to the carrier and connecting the clip to the second contact pad are performed by different connection methods.

According to an embodiment of the method of FIG. 1, connecting the semiconductor die to the carrier is performed by one of diffusion soldering, in particular without flux, or sintering, in particular silver sintering. It can then be the case that connecting the clip to the second contact pad is performed not by one of diffusion soldering or sintering but by, for example, one of using a solder paste or using a silver conductive adhesive.

According to an embodiment of the method of FIG. 1, connecting the clip to the second contact pad is performed by one of using a solder paste or using a silver conductive adhesive. It can then be the case that connecting the semiconductor die to the carrier is performed not by using a solder paste or using a silver conductive adhesive but by, for example, one of diffusion soldering, in particular without flux, or sintering, in particular silver sintering.

According to an embodiment of the method of FIG. 1, connecting the first bond wire to the first external contact and connecting the clip to the second contact pad is performed in such a way that the first bond wire is disposed at least partially under the clip. Examples thereof will be shown in connection with FIGS. 3 to 5 and the accompanying description of the semiconductor devices presented therein.

Figure 3A:
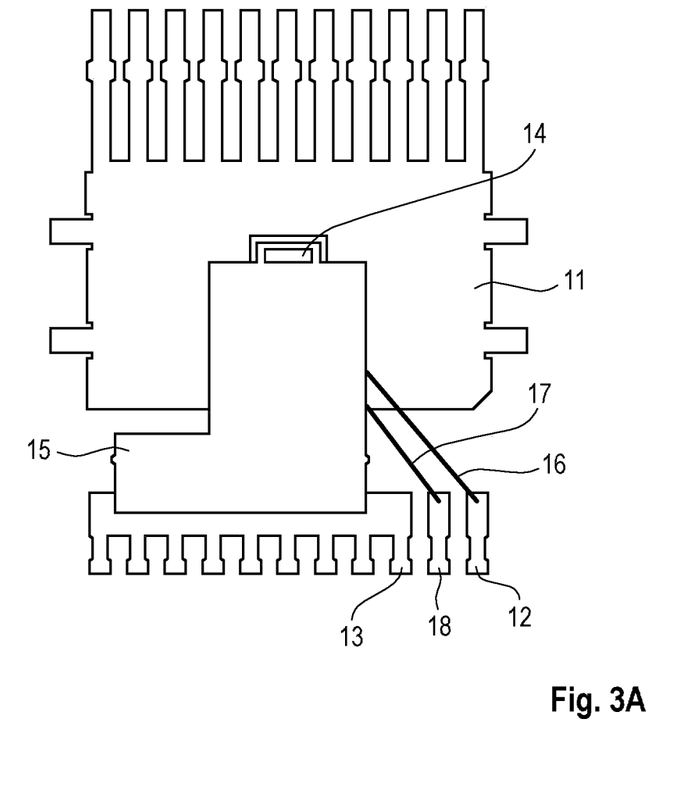
FIG. 3A shows a top view of an exemplary semiconductor device according to a third aspect.
Figure 3B:
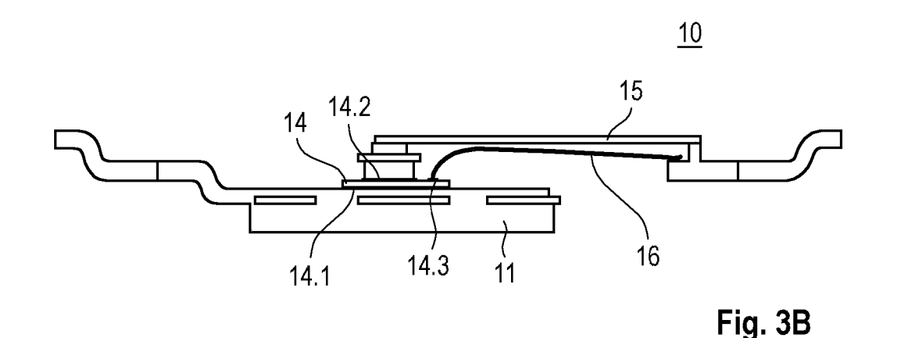
FIG. 3B shows a view of the semiconductor device of FIG. 3A from the left side with normal clearance between bond wire and clip.

FIGS. 3A and 3B show a yet unpackaged semiconductor device 10, in which device a bond wire is disposed partially under a clip with a normal clearance between them. FIG. 3A shows a top view of the unpackaged semiconductor device 10, and FIG. 3B shows a view of the unpackaged semiconductor device 10 from the left side.

More specifically, the semiconductor device 10 of FIGS. 3 and 3B comprises a carrier 11 such as a die pad, a first external contact 12 and a second external contact 13, a semiconductor die 14 comprising a first main face and a second main face opposite to the first main face, a first contact pad 14.1 disposed on the first main face, a second contact pad 14.2 disposed on the second main face, and a third contact pad 14.3 disposed on the second main face, wherein the semiconductor die 14 comprises a vertical transistor and is disposed with its first main face on the carrier 11, a clip 15 connecting the second contact pad 14.2 to the second external contact 13 and a first bond wire 16 connected with the first external contact 12, wherein the first bond wire 16 is connected between the third contact pad 14.3 and the first external contact 12, and wherein the first bond wire 16 is disposed at least partially under the clip 15.

The present disclosure, in particular the semiconductor device according to the third aspect, makes it possible to place the bond wire 16 onto the semiconductor die 14 and to allow a relatively wide clip 15 to be placed on the semiconductor die 14, in particular onto the second contact pad 14.2, of a semiconductor MOSFET or IGBT die. In this way it becomes possible to cover most of the surface of the second contact pad 14.2 with the clip 15 so that a higher current can be conducted through the transistor.

According to an embodiment of the semiconductor device 10, the first bond wire 16 is disposed only partly under the clip 15 as is the case in the embodiment as shown in FIGS. 3A and 3B. However, it is also possible that the first bond wire is disposed completely under the clip 15.

According to an embodiment of the semiconductor device 10, the second contact pad 14.2 is covered on most of its surface by the clip 15 as is the case in the embodiment as shown in FIGS. 3A and 3B. According to a further example thereof, the second contact pad 14.2 can also be completely covered by the clip 15.

According to an embodiment of the semiconductor device 10, the first external contact 12 is disposed on a lower level than the second external contact 13 in order to serve for a higher clearance between the bond wire and the clip. An embodiment thereof will be shown and explained later in connection with FIG. 5.

According to an embodiment of the semiconductor device 10, the first contact pad 14.1 is the drain contact pad, the second pad 14.2 is the source contact pad, and the third contact pad 14.3 is the gate contact pad.

According to an embodiment of the semiconductor device 10, a fourth contact pad is disposed on the second main face, wherein the semiconductor device further comprises a third external contact 18, and a second bond wire 17, wherein the second bond wire 17 is connected between the fourth contact pad and the third external contact 18. According to a further example thereof, the fourth contact pad is the source sense contact pad.

According to an embodiment of the semiconductor device 10, the semiconductor device further comprises an encapsulant 19 applied to the carrier/die pad 11, the semiconductor die 14, and the first 12 and second 13 external contacts. The encapsulant can in particular be applied such that a lower main face of the carrier/die pad 11 and an upper main face of the clip 15 are not covered by the encapsulant 19. Such a semiconductor device package allows efficient double-side cooling at the customer's side. A specific example thereof will be show and explained later in connection with FIG. 4.

According to an embodiment of the semiconductor device 10, the semiconductor die 14 is one of a silicon die, a silicon carbide die, or a gallium nitride die.

According to an embodiment of the semiconductor device 10, the carrier 11 and the first and second external contacts 12 and 13, and if present also the third external contact 18, are parts of a leadframe.

According to an embodiment of the semiconductor device 10, the wire bonds 16 and 17 are made of Cu or Al.

Figure 4:
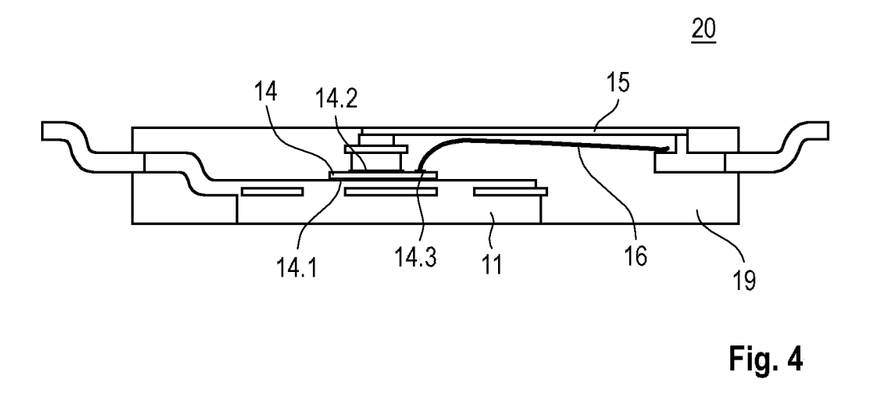
FIG. 4 shows the semiconductor device of FIG. 3B, wherein an encapsulant is applied to the semiconductor device so that an upper main face of the clip is exposed to the outside.

FIG. 4 shows a cross-sectional view of a packaged semiconductor device 20.

More specifically, the semiconductor device 20 of FIG. 4 comprises the semiconductor device 10 of FIGS. 3A and 3B, but with an additional encapsulant 19 applied thereto. The encapsulant can be applied to the semiconductor device 10 by, for example, transfer molding or compression molding and may comprise, for example, any kind of resin material like, for example, an epoxy resin. As can be seen in FIG. 4, the encapsulant 19 is applied in such a way that a lower main face of the carrier/die pad 11 as well as an upper main face of the clip 15 are not covered by the encapsulant 19. This allows the customer to efficiently cool the semiconductor device, as he can on the one hand dissipate the heat downwards via the substrate, e.g. a PCB, and on the other hand place an appropriate heat sink on top of the clip 15 for additional heat dissipation via the clip 15.

Figure 5:
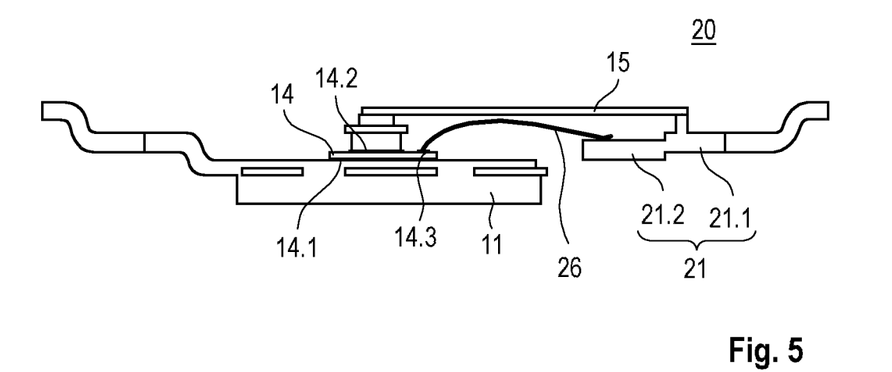
FIG. 5 shows a view of the semiconductor device of FIG. 3A from the right side, with higher clearance between bond wire and clip.

FIG. 5 shows a further exemplary semiconductor device according to the third aspect with higher clearance between bond wire and clip.

More specifically, FIG. 5 shows a semiconductor device 20 which is similar to the semiconductor device 10 as shown in FIGS. 3A and 3B so that equal reference signs for equal or similar parts were used. Besides that the semiconductor device 20 comprises a further feature, namely an external contact 21 which comprises a first portion 21.1 with which the clip 15 will be connected, and a second portion 21.2 with which the first bond wire 26 will be connected. As can be seen in FIG. 5, the second portion 21.2 is lowered compared to the first portion 21.1 so that the second portion 21.2 lies in a plane which is closer to the carrier/die pad 11 than the first portion. This allows to fabricate the semiconductor device 20 with a greater clearance or space between the bond wire 26 and the clip 15. There can be also a further lowered portion of the external contact 21 with which the further bond wire 17 can be connected. It should be added that this embodiment is especially suited when Al bond wires are used as they may comprise a thickness in the range of 70 to 80 μm. In case of Cu bond wires, which have a thickness in the range of 45 to 55 μm, the embodiment according to FIGS. 3A and 3B can be used.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A method for fabricating a semiconductor device, the method comprising:
    providing a carrier;
    providing a first external contact disposed in a first plane and a second external contact disposed in a second plane, wherein the first plane is lower than the second plane and the first plane is closer than the second plane to the carrier;
    providing a semiconductor die comprising a first main face, a second main face opposite to the first main face, a first contact pad disposed on the first main face, a second contact pad disposed on the second main face, a third contact pad disposed on the second main face, and a vertical transistor;
    connecting the semiconductor die with the first main face to the carrier;
    connecting one end of a first bond wire to the third contact pad and another end of the first bond wire to the first external contact; and
    connecting a first end of a clip to the second contact pad and a second end of the clip to the second external contact,
    wherein connecting the semiconductor die to the carrier and connecting the clip between the second contact pad and the second external contact are performed by different connection methods.

2. The method of claim 1, wherein connecting the semiconductor die to the carrier is performed by one of diffusion soldering or sintering.

3. The method of claim 1, wherein connecting the clip to the second contact pad is performed by one of using a solder paste or using a silver conductive adhesive.

4. The method of claim 1, wherein connecting the first bond wire between the first external contact and the third contact pad is performed between the steps of connecting the semiconductor die to the carrier and connecting the clip between the second contact pad and the second external contact.

5. The method of claim 1, wherein connecting the first bond wire to the first external contact and connecting the clip to the second contact pad are performed in such a way that the first bond wire is disposed at least partially under the clip.

6. A method for fabricating a semiconductor device, the method comprising:
    providing a carrier;
    providing a first external contact disposed in a first plane and a second external contact disposed in a second plane, wherein the first plane is lower than the second plane and the first plane is closer than the second plane to the carrier;
    providing a semiconductor die comprising a first main face, a second main face opposite to the first main face, a first contact pad disposed on the first main face, a second contact pad disposed on the second main face, a third contact pad disposed on the second main face, and a vertical transistor;
    connecting the semiconductor die with the first main face to the carrier;
    connecting one end of a first bond wire to the third contact pad and another end of the first bond wire to the first external contact; and
    connecting a first end of a clip to the second contact pad and a second end of the clip to the second external contact,
    wherein connecting the first bond wire between the first external contact and the third contact pad is performed between the steps of connecting the semiconductor die to the carrier and connecting the clip between the second contact pad and the second external contact.

7. The method of claim 6, wherein connecting the semiconductor die to the carrier and connecting the clip to the second contact pad are performed by different connection methods.

8. The method of claim 6, wherein connecting the semiconductor die to the carrier is performed by one of diffusion soldering or sintering.

9. The method of claim 6, wherein connecting the clip to the second contact pad is performed by one of using a solder paste or using a silver conductive adhesive.

10. The method of claim 6, wherein connecting the first bond wire to the first external contact and connecting the clip to the second contact pad are performed in such a way that the first bond wire is disposed at least partially under the clip.

11. A semiconductor device, comprising:
    a carrier;
    a first external contact and a second external contact;
    a semiconductor die comprising a first main face, a second main face opposite to the first main face, a first contact pad disposed on the first main face, a second contact pad disposed on the second main face, a third contact pad disposed on the second main face, a vertical transistor, the semiconductor die being disposed with the first main face on the carrier;
    a clip connecting the second contact pad to the second external contact; and
    a first bond wire connected with the first external contact,
    wherein the first bond wire is connected between the third contact pad and the first external contact,
    wherein the first bond wire is disposed at least partially under the clip.

12. The semiconductor device of claim 11, wherein the first bond wire is disposed only partly under the clip.

13. The semiconductor device of claim 11, wherein the second contact pad is partly covered by the clip.

14. The semiconductor device of claim 11, wherein the first external contact is disposed on a lower level than the second external contact.

15. The semiconductor device of claim 11, wherein the first contact pad is a drain contact pad, the second pad is a source contact pad, and the third contact pad is a gate contact pad.

16. The semiconductor device of claim 11, further comprising:
   a fourth contact pad disposed on the second main face;
   a third external contact; and
   a second bond wire,
      wherein the second bond wire is connected between the fourth contact pad and the third external contact.

17. The semiconductor device of claim 11, wherein the semiconductor die is one of a silicon die, a silicon carbide die, or a gallium nitride die.

18. The semiconductor device of claim 11, further comprising:
   an encapsulant applied to the carrier, the semiconductor die, and the first and second external contacts such that a lower main face of the carrier and an upper main face of the clip are not covered by the encapsulant.

19. The semiconductor device of claim 11, wherein a thickness of the clip at a region overlapping the first bond wire is the same as a thickness of the clip contacting the semiconductor die.

20. The semiconductor device of claim 12, wherein the first external contact is disposed in a first plane and the second external contact is disposed in a second plane, wherein the first plane is lower than the second plane and the first plane is closer than the second plane to the carrier.

* * * * *